(12) United States Patent
Wang et al.

(10) Patent No.: US 8,993,435 B2
(45) Date of Patent: Mar. 31, 2015

(54) LOW-K CU BARRIERS IN DAMASCENE INTERCONNECT STRUCTURES

(75) Inventors: Kuan-Chen Wang, Hsin-Chu (TW);
Po-Cheng Shih, Hsin Chiu (TW);
Chung-Chi Ko, Nantou (TW);
Keng-Chu Lin, Ping-Tung (TW);
Shwang-Ming Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1030 days.

(21) Appl. No.: 12/724,229

(22) Filed: Mar. 15, 2010

(65) Prior Publication Data

US 2011/0223759 A1 Sep. 15, 2011

(51) Int. Cl.
*H01L 21/4763* (2006.01)
*H01L 23/532* (2006.01)
*H01L 21/02* (2006.01)
*H01L 21/768* (2006.01)

(52) U.S. Cl.
CPC .... *H01L 23/53295* (2013.01); *H01L 21/02126* (2013.01); *H01L 21/02167* (2013.01); *H01L 21/02211* (2013.01); *H01L 21/02274* (2013.01); *H01L 21/02304* (2013.01); *H01L 21/76807* (2013.01); *H01L 21/76829* (2013.01); *H01L 21/76832* (2013.01); *H01L 21/76835* (2013.01); *H01L 23/5329* (2013.01); *H01L 23/53223* (2013.01); *H01L 2924/0002* (2013.01)
USPC ........... 438/634; 438/627; 438/653; 257/751; 257/752; 257/E23.16; 257/E23.161

(58) Field of Classification Search
CPC ..................... H01L 23/5329; H01L 23/53295; H01L 21/76829; H01L 21/76831; H01L 21/76834

USPC .............. 438/634, 627, 653; 257/751, E75.2, 257/E23.16, E23.161
See application file for complete search history.

(56) References Cited

U.S. PATENT DOCUMENTS

| | | | |
|---|---|---|---|
| 7,071,094 B2 | 7/2006 | Lu et al. | |
| 7,375,040 B2 | 5/2008 | Lin et al. | |
| 7,393,780 B2 | 7/2008 | Lu et al. | |
| 7,915,166 B1 * | 3/2011 | Yu et al. | 438/687 |
| 7,964,442 B2 | 6/2011 | Xu et al. | |
| 2003/0001273 A1 * | 1/2003 | Steiner et al. | 257/760 |
| 2004/0198070 A1 * | 10/2004 | Xia et al. | 438/786 |
| 2007/0228571 A1 * | 10/2007 | Yu et al. | 257/758 |
| 2010/0193898 A1 * | 8/2010 | Hautala et al. | 257/506 |
| 2011/0174770 A1 * | 7/2011 | Hautala | 216/13 |

FOREIGN PATENT DOCUMENTS

| | | |
|---|---|---|
| CN | 1430274 A | 7/2003 |
| CN | 1514477 A | 7/2004 |
| CN | 101419915 A | 4/2009 |

* cited by examiner

*Primary Examiner* — Kimberly D Nguyen
*Assistant Examiner* — Maria Ligai
(74) *Attorney, Agent, or Firm* — Slater & Matsil, L.L.P.

(57) ABSTRACT

In the formation of an interconnect structure, a metal feature is formed in a dielectric layer. An etch stop layer (ESL) is formed over the metal feature and the dielectric layer using a precursor and a carbon-source gas including carbon as precursors. The carbon-source gas is free from carbon dioxide ($CO_2$). The precursor is selected from the group consisting essentially of 1-methylsilane (1MS), 2-methylsilane (2MS), 3-methylsilane (3MS), 4-methylsilane (4MS), and combinations thereof.

18 Claims, 4 Drawing Sheets

LOW-K CU BARRIERS IN DAMASCENE INTERCONNECT STRUCTURES

TECHNICAL FIELD

This disclosure is related generally to integrated circuits, and more particularly to interconnect structures in integrated circuits and methods for forming the same, and even more particularly to the formation of low-k copper barriers in damascene interconnect structures.

BACKGROUND

Integrated circuits contain a plurality of patterned metal lines separated by inter-wiring spacings. Typically, metal patterns of vertically spaced metallization layers are electrically interconnected by vias. Metal lines formed in trench-like openings typically extend substantially parallel to a semiconductor substrate. Semiconductor devices of such type, according to current technology, may comprise eight or more metallization layers to satisfy device geometry and microminiaturization requirements.

A common process for forming metal lines or plugs is known as "damascene." Generally, this process involves forming an opening in a dielectric interlayer, which separates the vertically spaced metallization layers. The opening is typically formed using conventional lithographic and etching techniques. After an opening is formed, the opening is filled with copper or copper alloys to form a copper line and possibly a via. Excess metal material on a surface of the dielectric interlayer is then removed by chemical mechanical planarization (CMP).

To accurately control the formation of the opening, an etch stop layer may be used. FIG. 1 illustrates a cross-sectional view of an intermediate stage in the formation of a conventional interconnect structure. Dielectric layer 110 has copper line 112 embedded therein. Etch stop layer (ESL) 114 is formed over dielectric layer 110 and copper line 112. Low-k dielectric layer 120 is formed on ESL 114. Opening 122 is formed in low-k dielectric layer 120. During the formation of opening 122, ESL 114 is used to stop the etching of low-k dielectric layer 120.

In order to reduce the parasitic capacitance in interconnect structures, ESL 114 preferably has a low k value. However, in existing formation processes, the k value of ESL 114 can only be reduced to about 4.0 or greater. The reduction in the k value of ESL 114 may result in the etching selectivity of low-k dielectric layer 120 and ESL 114 to be sacrificed. Further, the reduction in the k value of ESL 114 may result in an increase in leakage in the resulting interconnect structures.

SUMMARY OF THE INVENTION

In accordance with one aspect of the present disclosure, in the formation of an interconnect structure, a metal feature is formed in a dielectric layer. An etch stop layer (ESL) is formed over the metal feature and the dielectric layer using a precursor and a carbon-source gas including carbon as precursors. The carbon-source gas is free from carbon dioxide ($CO_2$). The precursor is selected from the group consisting essentially of 1-methylsilane (1MS), 2-methylsilane (2MS), 3-methylsilane (3MS), 4-methylsilane (4MS), and combinations thereof.

Other embodiments are also included.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel interconnect structure of integrated circuits and a method of forming the same are provided. The intermediate stages of manufacturing an embodiment are illustrated. The variations of the embodiment are discussed. Throughout the various views and illustrative embodiments of the present disclosure, like reference numbers are used to designate like elements.

Figure 1:
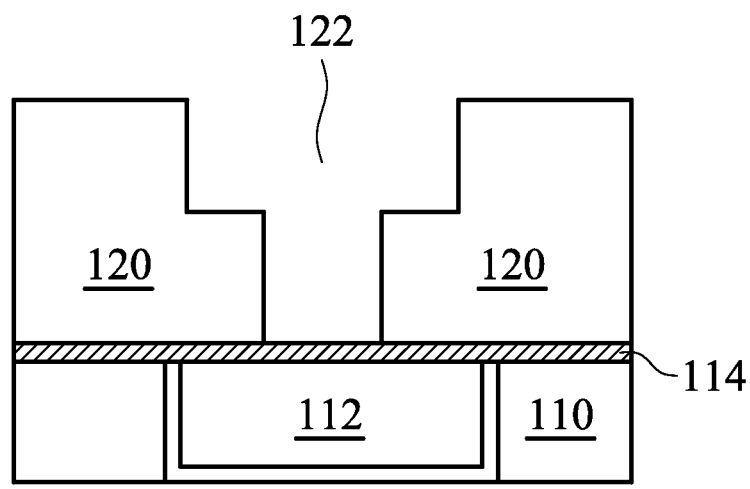
FIG. 1 illustrates a cross-sectional view of a conventional interconnect structure comprising an etch stop layer.
Figure 2:
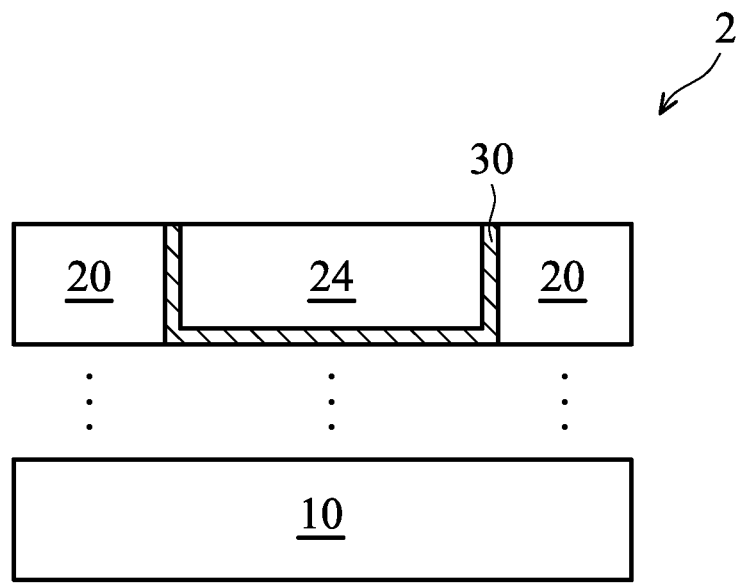
FIGS. 2 through 7 are cross-sectional views of intermediate stages in the manufacturing of an interconnect structure in accordance with an embodiment, which includes the formation of an etch stop layer.

FIGS. 2 through 7 are cross-sectional views of intermediate stages in the manufacturing of an interconnect structure in accordance with various embodiments. FIG. 2 illustrates wafer 2 including metal line 24 in dielectric layer 20, which is further formed over semiconductor substrate 10. Semiconductor substrate 10 may be a portion of an un-diced wafer. Semiconductor substrate 10 may be a silicon substrate or may comprise other semiconductor materials, such as SiGe, GaAs, or the like. Integrated circuits, such as PMOS and NMOS transistors (not shown), may be formed on a top surface of semiconductor substrate 10. In an embodiment, dielectric layer 20 is an inter-metal dielectric (IMD) having a low dielectric constant value (k value), for example, lower than about 3.5, or even lower than about 2.5. Low-k dielectric layer 20 may be formed of commonly used low-k dielectric materials, such as carbon-containing dielectric materials, and may further contain nitrogen, hydrogen, oxygen, and combinations thereof.

Diffusion barrier layer 30 and metal line 24 are formed in low-k dielectric layer 20. Diffusion barrier layer 30 may include titanium, titanium nitride, tantalum, tantalum nitride, and/or other alternatives. The material of metal line 24 may include copper or copper alloys. Throughout the description, metal line 24 is alternatively referred to as copper line 24, although it may also be formed of, or comprise, other conductive materials, such as silver, gold, tungsten, aluminum, and the like. The steps for forming copper line 24 may include forming a damascene opening in low-k dielectric layer 20, forming diffusion barrier layer 30 in the damascene opening, depositing a thin seed layer of copper or copper alloy, and filling the damascene opening, for example, by plating. A chemical mechanical planarization (CMP) is then performed to remove excess materials over low-k dielectric layer 20, resulting in the structure as shown in FIG. 2. For simplicity, substrate 10 is not shown in subsequent drawings.

Figure 3:
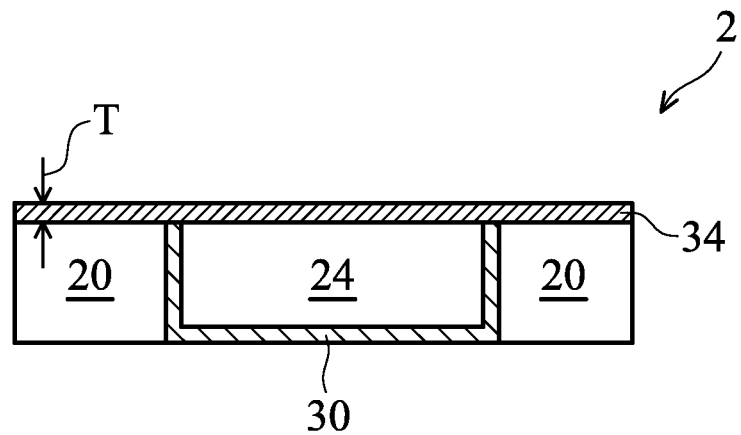

FIG. 3 illustrates the formation of etch stop layer (ESL) 34, which is also referred to as a copper barrier. Thickness T of ESL 34 may be between about 100 Å and about 500 Å, although different thicknesses may be used. ESL 34 may have a dielectric constant lower than about 4.0, or even lower than about 3.5, and may comprise a material selected from nitrogen doped (silicon) carbide (SiC:N, also known as NDC), oxygen doped (silicon) carbide (SiC:O, also known as ODC), and combinations thereof. The formation methods include commonly used chemical vapor deposition (CVD) methods, such as plasma enhanced chemical vapor deposition (PECVD). The reaction gases (precursors) depend on the desired composition of ESL 34, and may include silicon (Si), carbon (C), hydrogen (H), nitrogen (N), oxygen (O), boron (B), and/or the like. In an embodiment, the precursors include a gas selected from 1-methylsilane ($Si(CH)H_3$, also known as 1MS), 2-methylsilane ($Si(CH)_2H_2$, also known as 2MS), 3-methylsilane ($Si(CH)_3H$, also known as 3MS), 4-methylsilane ($Si(CH)_4$, also known as 4MS), and combinations thereof. Inactive gases, such as He, $N_2$, Ar, Xe, and the like may be used as ambient gases. If ODC is to be formed, $CO_2$ may also be added to provide oxygen. If NDC is to be formed, $NH_3$ may be added to provide nitrogen. Further, the precursors may include boron-containing gases such as $B_2H_6$, $BH_3$, or combinations thereof, to provide boron in the resulting ESL 34.

In addition to the above-discussed precursors, one or more carbon-source gas may be added to increase the carbon content in the resulting ESL 34. The carbon-source gas may be a carbon-rich source, which means that the atomic percentage of carbon in the carbon-source gas is high, for example, greater than about 10 percent, or even greater than about 20, or 30 percent. In an exemplary embodiment, the carbon-source gas is a carbon-hydrogen containing gas selected from $C_2H_4$, $C_2H_6$, and combinations thereof. With the additional carbon provided by the carbon-source gas, the carbon percentage in the resulting ESL 34 is increased, and the property of ESL 34 is improved. In an embodiment, the ratio of the flow rate of the carbon source gas to the flow rate of all 1MS/2MS/3MS/4MS gases is greater than about 2 to 4.

In an embodiment, the formation of ESL 34 is performed in a chamber using, for example, PECVD, wherein the temperature of wafer 2 may be between about 300° C. and about 500° C., and the chamber pressure may be between about 2 torrs and about 10 torrs. The power source for forming ESL 34 may include a high-frequency radio frequency (RF) power, for example, at a frequency of about 13.56 MHz, and a low-frequency RF power, for example, at a frequency of about 350 KHz. In the formation of ESL 34, the high-frequency RF power source may provide a power between about 100 watts and about 1,000 watts, while the low-frequency RF power source may provide a power lower than about 500 watts, and may be as low as zero watts (meaning no low-frequency power is provided). The high-frequency RF power and the low-frequency RF power may be provided simultaneously. In an exemplary embodiment for forming NDC, the wafer temperature is about 400° C., the chamber pressure is about 9 torrs, the high-frequency RF power is about 350 Watts, while the low-frequency RF power is turned off The ratio of the flow rates of 3MS, $C_2H_4$, $NH_3$, and He is about 1:3:1:5. It is realized, however, that these process conditions are merely examples and optimum conditions may be found through experiments.

Figure 4:
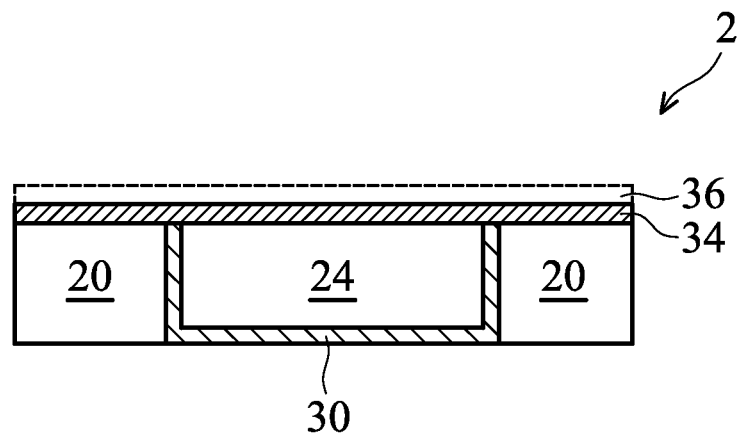

Next, as shown in FIG. 4, an optional tetra-ethyl-orthosilicate (TEOS) oxide layer 36 may be formed on ESL 34, using, for example, PECVD. The precursors for forming TEOS oxide 36 may include TEOS precursor and oxygen. TEOS oxide layer 36 may have a thickness less than about 500 Å, for example.

Figure 5:
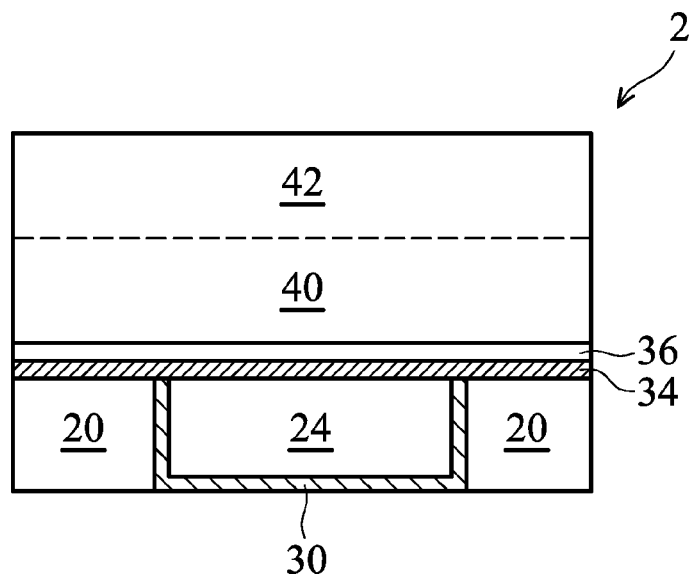

After ESL 34 and the optional TEOS oxide layer 36 are formed, more damascene process steps may be performed to form overlying structures, for example, a via and an overlying copper line. As is known in the art, the via and its overlying copper line can be formed by either a single damascene process or a dual damascene process. Referring to FIG. 5, via IMD layer 40 is first formed over ESL 34. Via IMD layer 40 may be a low-k dielectric layer having a k value less than about 3.5 or an ultra low-k dielectric layer having a k value less than about 2.7, and may comprise carbon-doped silicon oxide, fluorine-doped silicon oxide, organic low-k materials, and/or other porous low-k materials. The formation methods include spin-on, CVD, or other known methods. Trench IMD 42 is then formed over via IMD layer 40. Trench IMD 42 may be formed using similar methods and similar (or the same) materials as via IMD layer 40. Optionally, an etch stop layer (not shown) may be formed on via IMD layer 40 prior to the formation of trench IMD 42.

Figure 6:
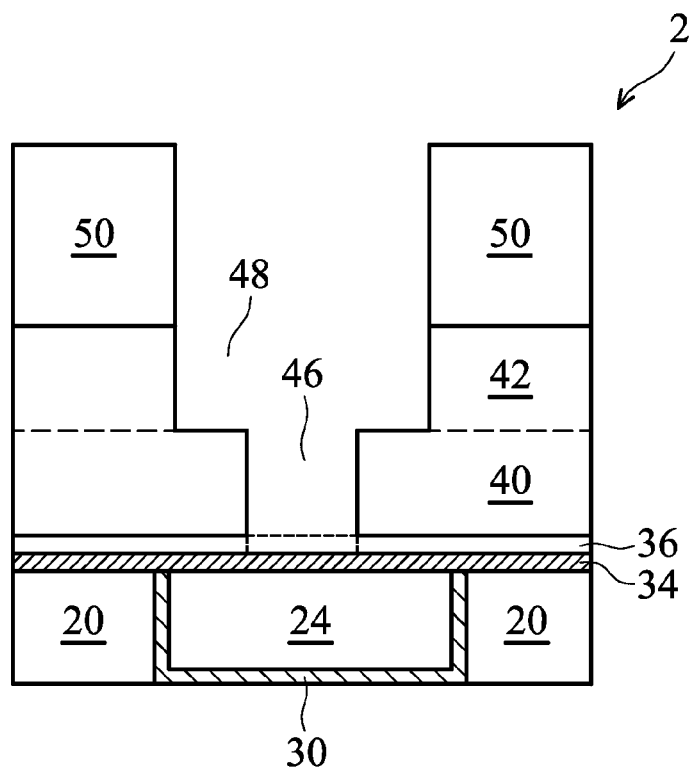

Referring to FIG. 6, via opening 46 and trench opening 48 are formed. The formation of via opening 46 and trench opening 48 may be assisted by photo resists for defining patterns. FIG. 6 illustrates photo resist 50 for defining the pattern of trench opening 48, wherein photo resist 50 is removed after the formation of trench opening 48. The formation of via opening 46 may use ESL 34 as an etch stop layer.

Figure 7:
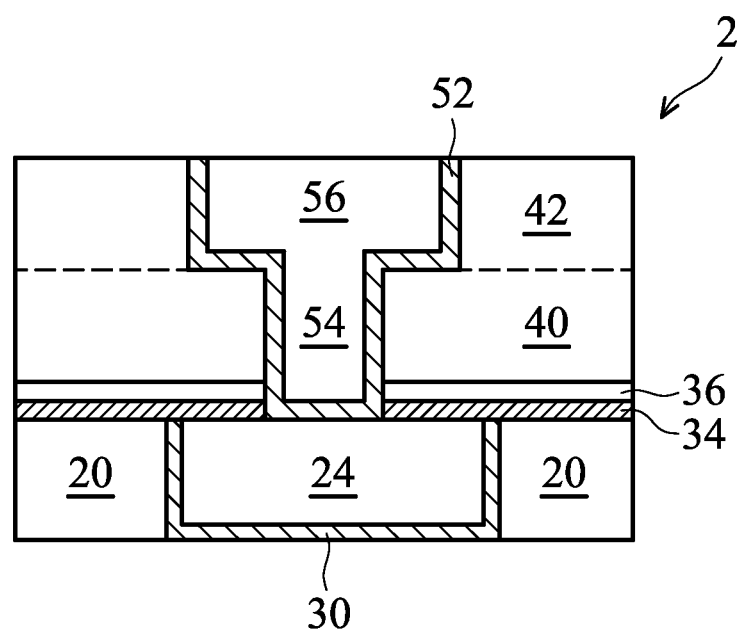

In subsequent process steps, as shown in FIG. 7, the exposed portion of ESL 34 (and optional TEOS oxide layer 36) is etched, followed by the formation of diffusion barrier layer 52. The remaining via opening 46 and trench opening 48 are then filled with conductive materials, such as copper or copper alloys. A chemical mechanical polish (CMP) is then performed to remove excess materials. The remaining portion of the conductive material forms conductive line 56 and via 54.

Experiments have revealed that ESL 34 has a very low k value, which may be between about 3.0 and about 4.0. As a comparison, conventional ODC has k values ranging between 4.0 and 5.0, and conventional NDC has k values greater than about 5.0. The etching rate of ESL 34 is also lower compared to conventional NDC and ODC that have no additional carbon added, and can be lower by 30 percent compared to that of conventional NDC and ODC. The leakage of ESL 34 may also be lower than that of conventional NDC and ODC by about three orders. These improved properties of ESL 34 result in the via resistance of vias (such as via 54 in FIG. 7) to be much lower with lower tailing. Further, the breakdown voltage and time-dependent dielectric breakdown (TDDB) behavior of the resulting interconnect structure are also improved. Experiment results indicate that the breakdown voltage may be as high as about 5.3 MV/cm when the leakage is 1E-03 $A/cm^2$, and the leakage may be as low as about 1E-08 $A/cm^2$ when the breakdown voltage is 2 MV/cm.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming an interconnect structure, the method comprising:
    forming a metal feature in a dielectric layer; and
    forming an etch stop layer (ESL) directly over the metal feature and the dielectric layer, wherein the ESL is a single layer comprising oxygen doped (silicon) carbide (ODC), and wherein the ESL is formed using precursors comprising:
        a precursor selected from the group consisting essentially of 1-methylsilane (1MS), 2-methylsilane (2MS), 3-methylsilane (3MS), 4-methylsilane (4MS), and combinations thereof; and
        a carbon-source gas comprising carbon, wherein the carbon-source gas comprises $C_2H_4$, and wherein the carbon-source gas is free from carbon dioxide ($CO_2$).

2. The method of claim 1 further comprising:
    forming a low-k dielectric layer over the ESL; and
    forming a metal line and a via in the low-k dielectric layer, wherein the metal line and the via are electrically coupled to the metal feature.

3. The method of claim 1, wherein the ESL is in physical contact with the metal feature and the dielectric layer.

4. The method of claim 3, wherein an entirety of the ESL is formed of a homogeneous material.

5. The method of claim 1, wherein an entirety of the ESL is formed of ODC.

6. A method of forming an interconnect structure, the method comprising:
    forming a first metal line extending from a top surface of a first low-k dielectric layer into the first low-k dielectric layer, wherein the first low-k dielectric layer is over a substrate; and
    forming an etch stop layer (ESL) directly over and contacting the first metal line and the first low-k dielectric layer, wherein the ESL is a single layer, and wherein precursors used in the step of forming the ESL comprise a carbon-source gas, a boron-containing gas, and an additional precursor comprising silicon and carbon.

7. The method of claim 6, wherein the additional precursor is selected from the group consisting essentially of 1-methylsilane (1MS), 2-methylsilane (2MS), 3-methylsilane (3MS), 4-methylsilane (4MS), and combinations thereof.

8. The method of claim 6, wherein the carbon-source gas further comprises hydrogen.

9. The method of claim 8, wherein the carbon-source gas is $C_xH_y$.

10. The method of claim 9, wherein the carbon-source gas comprises $C_2H_4$.

11. The method of claim 6 further comprising:
    forming a second low-k dielectric layer over the ESL; and
    forming a second metal line and a via in the second low-k dielectric layer, wherein the second metal line and the via are electrically coupled to the first metal line.

12. The method of claim 11 further comprising forming a tetra-ethyl-ortho-silicate (TEOS) oxide layer between and contacting the ESL and the second low-k dielectric layer.

13. A method of forming an interconnect structure, the method comprising:
    forming a metal feature in a dielectric layer; and
    forming an etch stop layer (ESL) over and in physical contact with the metal feature and the dielectric layer, wherein the ESL is a single layer comprising nitrogen doped silicon carbide (SiN:C), and wherein the ESL is formed using precursors comprising:
        a precursor selected from the group consisting essentially of 1-methylsilane (1MS), 2-methylsilane (2MS), 3-methylsilane (3MS), 4-methylsilane (4MS), and combinations thereof; and
        a carbon-source gas comprising carbon, wherein the carbon-source gas comprises $C_2H_4$, and wherein the carbon-source gas is free from carbon dioxide ($CO_2$).

14. The method of claim 13, wherein the precursors further comprise $NH_3$.

15. The method of claim 13, wherein the forming the ESL is performed using Plasma Enhanced Chemical Vapor Deposition (PECVD).

16. The method of claim 13 further comprising forming a tetra-ethyl-ortho-silicate (TEOS) oxide layer over and contacting the ESL.

17. The method of claim 13 further comprising:
    forming a second low-k dielectric layer over the ESL; and
    forming a second metal line and a via in the second low-k dielectric layer, wherein the second metal line and the via are electrically coupled to the metal feature.

18. The method of claim 13, wherein an entirety of the ESL is formed of nitrogen doped silicon carbide.

* * * * *